United States Patent [19]

Morgan

[11] 3,940,697
[45] Feb. 24, 1976

[54] MULTIPLE BAND SCANNING RADIO
[75] Inventor: Eugene L. Morgan, Dix Hill, N.Y.
[73] Assignee: Hy-Gain Electronics Corporation, Lincoln, Nebr.
[22] Filed: Dec. 2, 1974
[21] Appl. No.: 528,920

[52] U.S. Cl. .................. 325/333; 325/442; 325/462
[51] Int. Cl.² .......................................... H04B 1/26
[58] Field of Search ........... 325/442, 443, 458, 459, 325/461, 462, 332, 333, 335, 439

[56] References Cited
UNITED STATES PATENTS

| | | | |
|---|---|---|---|
| 3,348,154 | 10/1967 | Fish, Jr. et al. .................. | 325/439 |
| 3,443,230 | 5/1969 | Pratt .................................. | 325/333 |
| 3,631,348 | 12/1971 | Lehmann .......................... | 325/458 |
| 3,801,922 | 4/1974 | Muszkiewicz .................... | 325/459 |
| 3,845,393 | 10/1974 | Basset .............................. | 325/459 |

Primary Examiner—George H. Libman
Attorney, Agent, or Firm—Vincent L. Carney

[57] ABSTRACT

To scan channels in a plurality of bands using a single first mixer, an FET transistor in an adaptive first mixer of the scanning radio, in response to a signal from a counter in the scanning local oscillator representing the frequency band of the channel being scanned, has: (1) its gate electrode connected to the output of a selected RF amplifier of a plurality of RF amplifiers for different bands; and (2) its source electrode electrically connected to receive local oscillations through a selected one of a plurality of different impedance networks. These connections enable the adaptive first mixer to maintain sufficiently high conversion gain when receiving signals on channels in any one of a plurality of different frequency bands.

9 Claims, 5 Drawing Figures

MULTIPLE BAND SCANNING RADIO

This invention relates to scanning receivers and more particularly relates to multiple band scanning receivers.

In one class of multiple band scanning receiver, RF signals are received from any of a plurality of RF amplifiers or input impedances that are selected to provide satisfactory impedance matching to the mixer for the band being received and these RF signals are beat with local oscillations for the channel in that band which local oscillations are received through an input impedance that is selected to provide satisfactory matching to the local oscillator, thus generating with sufficient conversion gain intermediate frequency signals for application to the IF stage of the scanning receiver.

In one type of prior art receiver of this class, a signal from the scanning local oscillator connects one of a plurality of RF amplifiers and one of a plurality of mixers between the antenna and the IF stage. The RF amplifier and mixer combinations are matched to maintain sufficient conversion gain for the band of the selected channel.

The prior art scanning receivers have the disadvantage of requiring a plurality of mixers.

Accordingly, it is an object of the invention to provide a novel scanning radio.

It is a further object of the invention to provide a novel multiple band scanning radio having a single mixer.

In accordance with the above and further objects of the invention, a multiple band scanning radio includes an adaptive first mixer, a scanning local oscillator, an RF amplifier section, IF and audio stages and a speaker.

The scanning local oscillator includes a plurality of crystal circuits for controlling a local oscillator, causing it to generate a sequence of different frequency local oscillations corresponding to channels in a plurality of frequency bands in response to timing pulses applied to it. When a particular channel is received during scanning and a modulated carier in that channel is being received by the radio, the scanning is stopped by a signal from the squelch control circuit within the radio.

The adaptive first mixer includes two switching networks, one of which responds to signals from the scanning local oscillator to connect one of a pluality of RF amplifiers (or input impedances in a receiver not using RF amplifiers) to the gate electrode of an FET transistor and the other of which connects the local oscillations to the source electrode of the FET transistor through a selected input impedance so that the FET transistor maintains adequate conversion gain while generating the intermediate frequency beat oscillations. The output from the drain of the FET transistor is applied to the IF stage.

As can be understood from the above description, the scanning radio of this invention has the advantage of being able to receive channels in a plurality of different bands with only one mixer.

The above noted and other features of the invention will be better understood from the following detailed description when considered with reference to the accompanying drawings in which.

Figure 1:
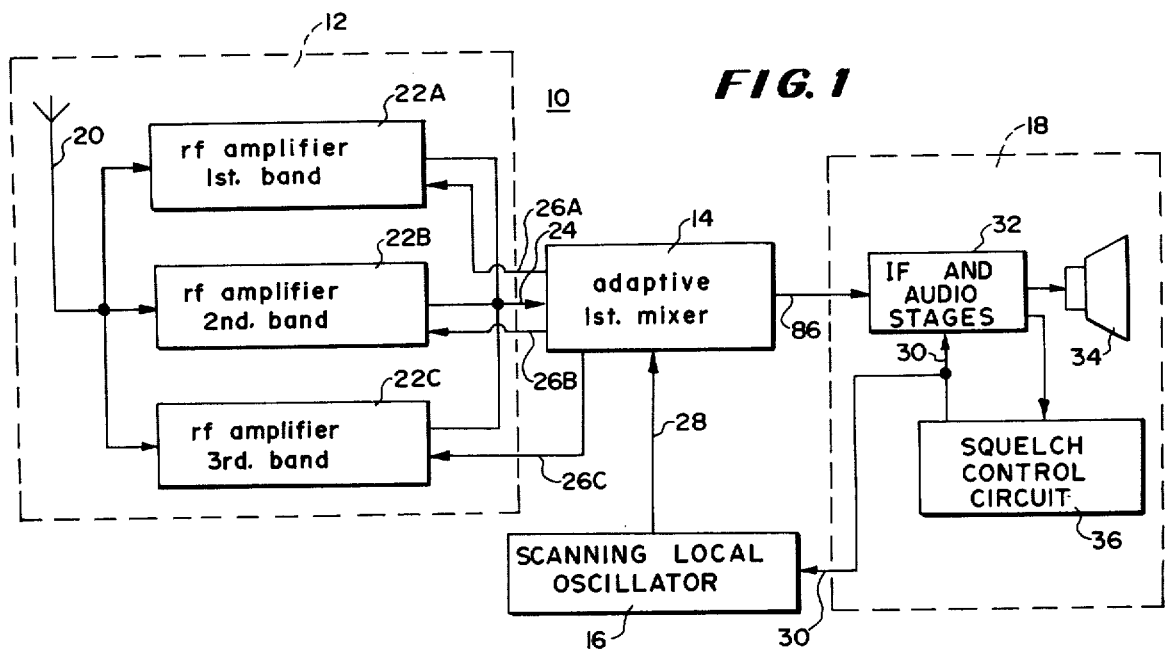
FIG. 1 is a block diagram of a scanning receiver in accordance with an embodiment of the invention.

In FIG. 1, there is shown a block diagram of a scanning receiver 10 having a radio frequency section 12, an adaptive first mixer 14, a scanning local oscillator 16, and an intermediate frequency and audio section 18. The radio frequency section 12 is electrically connected to the adaptive first mixer 14 to which it applies amplified radio frequency signals that is has received. The adaptive first mixer 14 converts the radio frequency signals to intermediate frequency signals for application to the intermediate frequency and audio section 18, which further processes the signals.

The scanning local oscillator 16 is connected to the adaptive first mixer 14 and to the intermediate frequency and audio section 18 so that it scans certain channels to locate a channel that is being used and, in response to a signal from the intermediate frequency and audio section 18, locks on that channel, applying the appropriate frequency local oscillations to the adaptive first mixer 14.

To receive radio frequency energy, the radio frequency section 12 includes an antenna 20, and three RF amplifiers 22A–22C, which amplify a first, second and third band respectively. The antenna 20 is connected to the input of each of the RF amplifiers 22A–22C to provide to them any radio signals received. The outputs of each of the radio frequency amplifiers 22A–22C are electrically connected to an input of the adaptive first mixer 14 through a conductor 24 to provide an amplified signal to one input of the mixer and a control circuit of the adaptive first mixer 14 is electrically connected to a different switch in each of the RF amplifiers 22A–22C through a corresponding one of the conductors 26A–26C to select the particular RF amplifier that is to apply signals to the adaptive first mixer through the conductor 24.

To enable the adaptive first mixer 14 to produce an intermediate frequency signal from the radio frequency signals received from the radio frequency section 12, the scanning local oscillator 16 is electrically connected to the adaptive first mixer 14 through a cable 28, which includes one conductor that applies a sequence of frequencies to the adaptive first mixer 14 as the channels are scanned to find one that is operating and a plurality of other conductors which indicate to the adaptive first mixer 14 which channel is being scanned. The scanning local oscillator 16 is electrically connected to the intermediate frequency and audio section 18 through a conductor 30 which signals the scanning local oscillator 16 when a modulated carrier has been received and processed by the adaptive first mixer 14 so as to terminate scanning and lock on the operating channel.

To process modulated carriers that have been received, the intermediate frequency and audio section 18 includes the IF and audio stages 32, a speaker 34, and a squelch control circuit 36, with the squelch control circuit 36 being connected to a discriminator within the IF and audio stages 32 to receive a signal when a modulated carrier is being processed. To cause a processed modulated signal to be applied to the speaker 34 for broadcasting to a listener and to lock the scanning local oscillator 16 on a particular channel, the squelch control circuit 36 is electrically connected to the IF and audio stages 32 through the conductor 30 as well as to the scanning local oscillator 16.

In operation, as the scanning local oscillator 16 scans the channels which are being received by the radio frequency section 12 the adaptive first mixer 14 selects the appropriate RF amplifier 22 and appropriate input impedance of the mixer for the frequency from the scanning local oscillator for each channel, beating the output from the RF amplifiers and the output from the scanning local oscillator to produce an IF signal that it applies to the intermediate frequency and audio section 18 for further processing.

To scan the channels, the scanning local oscillator generates a series of discrete frequencies and applies them one at a time to the adaptive first mixer. For this purpose, the scanning local oscillator includes a plurality of circuits, each of which has a different crystal which is connectable by a counter into a circuit with a portion of a common local oscillator. This circuit generates the sequence of preselected frequencies in different bands and applies them to a conductor that is connected to the mixer 14.

To select the input conditions appropriate to the band of the channel that is being scanned, the adaptive first mixer 14 selects a particular one of the RF amplifiers 22 in the band being scanned and a particular input impedance for the input from the local oscillator and then beats the signal from that RF amplifier with the signal from the scanning local oscillator 16 received through the selected impedance. By mixing the signal from a selected RF amplifier and the signal from the scanning local oscillator through a selected impedance appropriate to the band being received, the conversion gain of the mixer 14 is maintained sufficiently high so that one mixer can process channels in different bands.

To process and lock the IF signal from the mixer 14, the intermediate frequency and audio section 18 receives the intermediate frequency from the adaptive first mixer 14, amplifies it, converts it to an audio signal and applies it to the speaker 34. If it is modulated, the discriminator applies a signal to the squelch control circuit 36, which gates the signal to the speaker 34 on the conductor 30 and at the same time stops the scanning of the scanning local oscillator by applying a signal on the conductor 30 to the scanning local oscillator 16.

As can be understood from the above description, the scanning receiver described above has the advantages of: (1) being able to receive frequencies which are in different bands using the same mixer; (2) being economical in construction; and (3) being reliable because of its simplicity.

Figure 2:
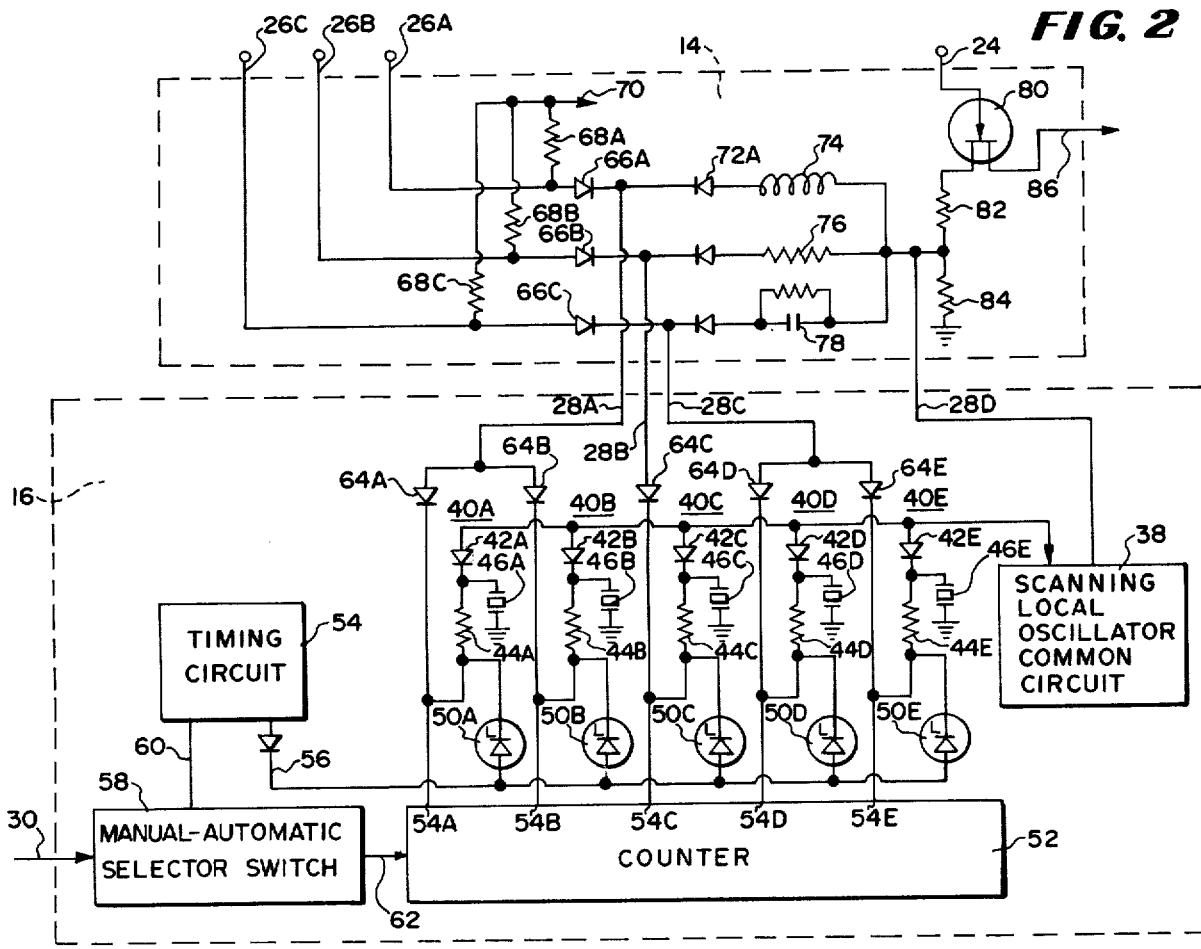
FIG. 2 is a schematic circuit diagram, including some functional blocks, of a scanning local oscillator and adaptive first mixer which may be used in the embodiment of scanning receiver of FIG. 1.

In FIG. 2, there is shown a schematic circuit diagram of the adaptive first mixer 14 and the scanning local oscillator 16, with some of the components being shown in block diagram form.

To transmit a sequence of frequencies through the conductor 28D to the adaptive first mixer 14, the scanning local oscillator 16 includes an oscillator having a scanning local oscillator common cicuit 38 and a crystal array, with the array consisting of a plurality of channels 40A–40E connected to the scanning local oscillator common circuit for cooperation therewith in generating the plurality of discrete channel frequencies. The output of the scanning local oscillator common circuit 38 is electrically connected to conductor 28D. Each of the chanels 40A includes a different one of the diodes 42A–42E, the resistors 44A–44E, the crystals 46A–46E and the LED lamps 50A–50E.

To select a particular one of the channels 40A–40E to cooperate with the scanning local oscillator common circuit 38, the scanning local oscillator includes a counter 52 and a timing circuit 54, the timing circuit 54 having an output electrically connected to the counter 52 through a manual-automatic selector switch to apply counting pulses to the counter. The counter 52 has different ones of its output terminals 54A–54E connected in a series circuit with corresponding ones of the resistors 44A–44E, diodes 42A–42E and the input of the scanning local oscillator common circuit in the order named, with the anodes of the diodes 42A being connected to the input of the scanning local oscillator common circuit 38 so as to have their reverse impedance path directed to block sneak current paths during selection of the channels. Corresponding ones of the crystals 46A–46E have one electrode electrically connected between the cathode of a corresponding one of the diodes 42A–42E and one end of a corresponding one of their resistors 44A–44E, the other electrodes being grounded.

To indicate the channel being scanned, the timing circuit 55 has an output conductor 56 connected to the anodes of each of the LED lamps 50A–50E through the forward conduction path of a diode 57, the cathodes of the LED lamps 50A–50E being connected between corresponding ones of the resistors 44 and switches 48.

To select manual or automatic scanning and to permit locking of the scanning local oscillator 16 during automatic scanning, the manual automatic selector switch 58 is electrically connected: (1) to the conductor 30 to receive signals from the squelch control cicuit 36 (FIG. 1); (2) to the timing circuit 54 through the conductor 60 to receive timing pulses; and (3) to the counter 52 through a conductor 62 to apply counting pulses thereto for scanning.

To provide signals to the adaptive first mixer 14 indicating the frequency band of the channel being scanned, the conductors 28A–28C are each connected to certain ones of the output terminals 54A–54E of the counter 52, the connections being made through the forward conduction path of corresponding ones of the diodes 64A–64E to prevent sneak current paths.

To connect the appropriate RF amplifier to receive signals corresponding to the frequency band of the channel being scanned, the adaptive first mixer 14 includes three diodes 66A–66C, three resistors 68A–68C and a source of positive potential 70, with each of the conductors 26A–26C that is connected to a corresponding one of the RF amplifiers 22A–22C (FIG. 1) being connected to one end of a corresponding one of the resistors 68A–68C and to a corresponding one of the conductors 28A–28C through the forward conduction path of a corresponding one of the diodes 66A–66C, the other ends of each of the resistors 68A–68C being connected to the source of positive potential 70. With these connections, the conductor 28 that is grounded by the counter 52, pulls a corresponding one of the conductors 26 to ground level and the other conductors 26 receives a positive potential from the potential source 70 since their corresponding diodes 66 are blocked by the positive output potentials on the other terminals of the counter 52.

To adjust the input impedance of the adaptive first mixer 14 to the signal from the local oscillator, the adaptive first mixer 14 includes three diodes 72A–72C, an inducator 74, a resistor 76 and a capacitor 78 shunted by a resistor 79, with the inductor 74, the resistor 76, and the capacitor 78 each having one end connected to the anode of a different one of the diodes 72A–72C, the cathodes of the diodes 72A–72C each being connected to a corresponding one of the conductors 28A–28C, the other end of the inductor 74, resistor 76, and capacitor 78 being electrically connected to the conductor 28D to change the input impedance presented to the scanning local oscillator common circuit 38 as the counter 52 counts from channel position to channel position.

Suitable values for the impedances 74, 76 and 78 are calculated in a manner known in the art for adequate conversion gain for the particular mixer and frequency desired. There are many references describing in detail the techniques to be used in obtaining impedances that are to be matched with a mixer. One reference which is particularly suitable in the opinion of the applicant is TRANSISTOR MIXER DESIGN USING ADMITTANCE PARAMETERS AN-238 Technical Information Note by Ernest Klein published by Motorola Semiconductor Products, Inc., in 1967, Box 955, Phoenix, Ariz. 85001. Other standard books on radio design provide techniques which can be used instead and the cited reference is only referred to as a design criteria which the applicant finds especially useful.

To mix the signal from a selected one of the RF amplifiers 22 (FIG. 1) with the signal from the scanning local oscillator 16, the adaptive first mixer 14 includes an FET transistor 80 and two resistors 82 and 84, with the following electrical connections: (1) the gate of the FET transistor 80 connected to the output of the RF amplifiers 22 (FIG. 1) through the conductor 24; (2) the source of the FET transistor 80 connected to the conductor 28D through the resistor 82; (3) the resistor 84 connected between ground and the conductor 28D; and (4) the source of the FET transistor 80 being connected to the intermediate frequency and audio section 18 (FIG. 1) through the conductor 86.

In operation, the timing circuit 55 generates timing pulses for scanning and indicating the channels being scanned. At each pulse time, the counter steps one position and for that position: (1) selects one of the RF amplifiers 22 (FIG. 1) to apply a signal to the adaptive first mixer 14; (2) selects an appropriate input impedance for the adaptive mixer 14 through which the signal from the scanning local oscillator 16 is to be received; (3) selects a channel 40 to cause the local oscillator 16 to apply a particular discrete frequency to the adaptive first mixer 14; and (4) indicates the channel being scanned. When a modulated signal is received, the counter is locked on the channel receiving the signal so that it may be broadcast to the listener.

To generate timing pulses, the timing circuit 55 includes an astable multivibrator which has a five-to-one duty cycle, with the shorter pulse being applied to the conductor 56 to pulse the lamps 50 and the longer pulse being applied to the manual-automatic selector switch 58 for stepping the counter 52.

The manual-automatic selector switch may be set in either of two modes: (1) the manual mode; or (2) the automatic mode. In the automatic mode, the timing pulses from the timing circuit 55 are applied through the conductor 62 to the counter 52, causing it to scan from position to position. In the manual mode, the pulses from the timing cicuit 55 are disconnected and applied only when a push button is depressed in one embodiment or in another embodiment disconnected altogether with a different DC source being connected to the counter 52 whenever a push button is depressed to cause the counter to step from position to position.

To select a particular amplifier 22 (FIG. 1), the counter 52 grounds the output terminal which is being counted and applies a positive potential to all other output terminals. The positive potential is blocked by the reverse impedance of the diodes 64A except for the grounded terminal which creates a conduction path from the source of potential 70 through one of the resistors 68, through the selected one of the diodes 64A to the grounded terminal 54. This conduction path causes the potential from the conductor 70 to fall across the selected resistor 68 to apply a negative-going pulse to one of the conductors 26A, which negative-going pulse switches on the particular RF amplifier.

To prevent the other two amplifiers from transmitting their signal to the adaptive first mixer 14, the positive pulse on the other two of the conductors 26 from the counter 52 blocks two of the diodes 68 and a positive potential maintained on the amplifiers. In this manner, one amplifier 22 only is permitted to apply its output to the adaptive first mixer 14 at any one time and this amplifier is selected in accordance with the frequency of the channel selected by the scanner.

To select the input impedance for the adaptive first mixer 14 corresponding to the signal that is to be received from the scanning local oscillator 16 for the selected channel, the grounded terminal of the counter 52 provides a conductive path between the conductor 28D through a selected one of the inductor 74, resistor 76 or capacitor 78 and its corresponding diodes 72 and 64. The other two impedances are in an open circuit, because the corresponding diodes 72 and 64 are blocked by the positive potential on the counter 52.

To apply the selected frequency from the scanning local oscillator 16, the grounded terminal of the counter 52 opens a path of conduction from the scanning local oscillator common circuit 38 through one of the diodes 42, resistors 44 and crystals 46 in the selected one of the channels 40A–40F, the other paths being blocked by the other diodes 42 which receive a positive potential on their cathodes from the counter 52. The crystal 46 in the selected channel is permitted to vibrate in the circuit including the resistor 44 since one end of each is connected to ground. The vibrating crystal controls the frequency of the crystal controlled oscillator.

The output from the scanning local oscillator common circuit 38 is applied through conductor 28D to the source of the FET transistor 80 where it is beat against the signal from the selected RF amplifier and transmitted to the gate of the FET transistor 80, resulting in an intermediate frequency signal on conductor 86 being applied to the intermediate frequency and audio stages 32 (FIG. 1).

To indicate the channel that is currently controlling the frequency applied to the adaptive first mixer 14 by the scanning local oscillator 16, the timing circuit 55 applies short positive pulses to the anodes of each of the LED diode lamps 50. Each pulse is blocked at the terminals of all of the counters which have a positive potential, but is conducted through a diode having its cathode connected to the selected grounded terminal, causing the diode to emit light and indicate the channel being scanned. The diode 57 prevents reverse breakdown of the unselected LED diodes 50.

The counter stops with each pulse applied to it during the scanning process until a signal from the squelch control circuit 36 (FIG. 1) is received on the conductor 30. This signal disconnects the pulses from conductor 62 to prevent further scanning of the counter 52. Consequently, the signal being received on the antenna 20 at that time is processed and broadcast from the speaker 34 (FIG. 1) until it ends, at which time the scanning proceeds further.

The timing cicuit 55, manual-automatic selector switch 58, counter 52, and scanning local oscillator common circuit 38 and the portion of the circuit which cooperates with the scanning local oscillator common circuit 38 to generate the discrete frequencies are described in greater detail in U.S. patent application Ser. No. 467,456 to Eugene L. Morgan, filed May 6, 1974 and assigned to Hy-Gain Electronics Corporation. Moreover, other scanning arrangements may be used in the same manner to control the selection of the RF amplifiers and input impedance for the FET transistor 80 to adapt the mixer to the different channels being received without unduly diminishing its conversion gain.

Figure 3:
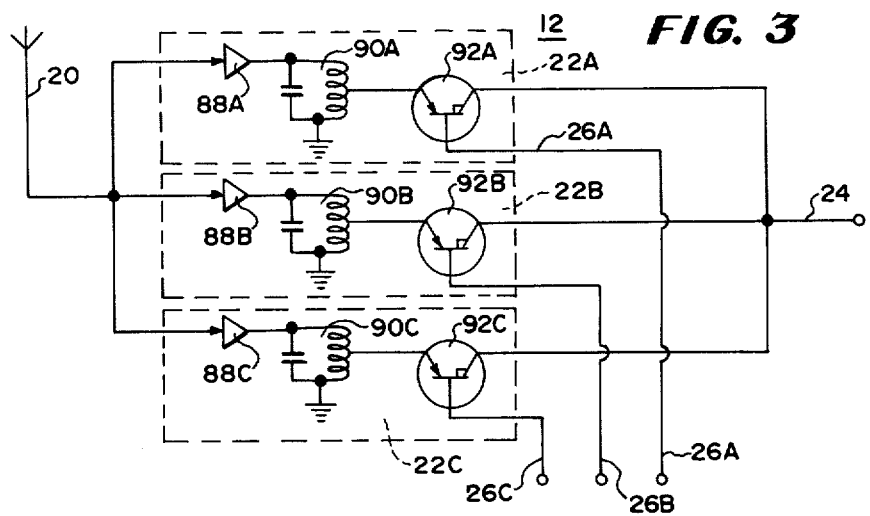
FIG. 3 is one embodiment of RF section which may be used in the embodiment of scanning receiver of FIG. 1.

In FIG. 3, there is shown one embodiment of radio frequency section 12 which may cooperate in the scanning receiver 10. As shown in this figure, each of the RF amplifiers 22A–22C includes a corresponding one of the amplifier circuits 88A–88C, the resonant circuit 90A–90C and the transistors 92A–92C, with each of the corresponding amplifier circuits 88, resonant circuits 90 and 92 in one RF amplifier being connected in series in the order named between the antenna 20 and the conductor 24, the base electrodes of the transistors 92A–92C being connected to the conductors 26A–26C respectively.

In the preferred embodiment, the RF amplifiers are adapted to receive channels in FCC bands corresponding generally to 450 megacycles, 150 megacycles and 50 megacycles. However, in a manner known in the art, circuit changes can be made to adapt the scanning radio to receive different channels in other, more or fewer bands.

In operation, the signals received by the antenna 20 are applied to each of the amplifiers 88A–88C, the outputs of which are applied to the resonant circuits 90A–90C and from the resonant circuits to the emitters of the transistors 92A–92C. Of couse, some selection of the appropriate frequencies for the different RF amplifiers 22 is made within the amplifiers and the tank circuits. Nevertheless, some output signal may be provided by each of the amplifiers in response to the same carrier wave received by antenna 20, but the output from the conductor 24 is determined by the conductive state of the transistors 92, one of which is driven to its conductive state by a ground level potential on a selected one of the conductors 26A–26C connected to its base and the others of which are biased to their nonconductive state by a positive potential on the corresponding ones of the conductors 26A–26C.

The selected RF amplifier applies an output signal to the conductor 24 for transmission to the adaptive first mixer 14 and the other two radio frequency amplifiers are blocked. This enables a proper matching of RF amplifier to mixer to maintain the conversion gain of the mixer even though channels in different bands are received at different successive times. Of course, other RF switches may be used instead of the transistors 92 such as PIN diodes, each having its anode connected to a different resonant circuit 90 and to a different one of the conductors 26 and having its cathode connected to the conductor 24.

Figure 4:
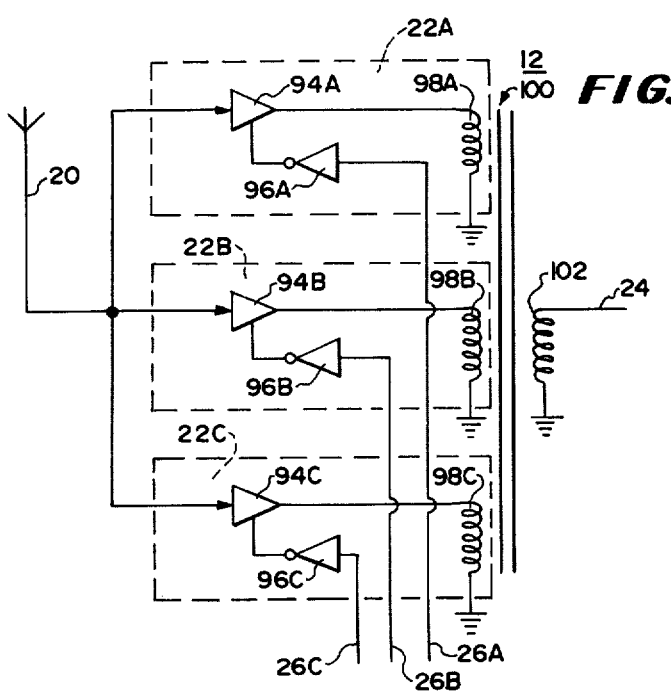
FIG. 4 is a second embodiment of RF section which may be used in the scanning receiver of the embodiment of FIG. 1.

In FIG. 4, there is shown another embodiment of radio frequency section 12 in which each of the radio frequency amplifiers 22A–22C include a corresponding one of three amplifying circuits 94A–94C, a corresponding one of three inverting circuits 96A–96C and a corresponding one of three primary coils 98A–98C of a broad band toroidal transformer 100 having a single secondary winding 102, to which the conductor 24 is connected.

In each of the RF amplifiers 22, the antenna 20 is connected to the input of a different one of the amplifier circuits 92 and the outputs of the amplifier circuits 94 are connected to the primary winding 98. The amplifier circuits 94 are connected to the primary winding 98. The amplifier circuits 94 are PMOS amplifiers and the output of each of the inverters 96 is connected to a corresponding one of the amplifier cicuit inputs to deenergize the amplifier circuits upon receiving ground level pulses. The inputs of each of the inverters 96A–96C are connected to corresponding ones of the conductors 26A–26C to select the amplifier circuit to which a positive pulse is to be applied.

In operation, the ground level input from the selected one of the conductors 26 results in a positive output from the corresponding inverter 96 being applied to the corresponding PMOS amplifying circuit 94, causing this amplifier to be energized. Since the other amplifiers are receiving low outputs from their corresponding inverters, they remain deenergized. The primary winding 98 corresponding to the amplifier circuit 94 that is energized receives the amplified signal from the antenna 20 and applies it to the transformer 100, which in turn causes it to be induced in the secondary winding 102 for application to the adaptive first mixer 14 (FIG. 1).

Figure 5:
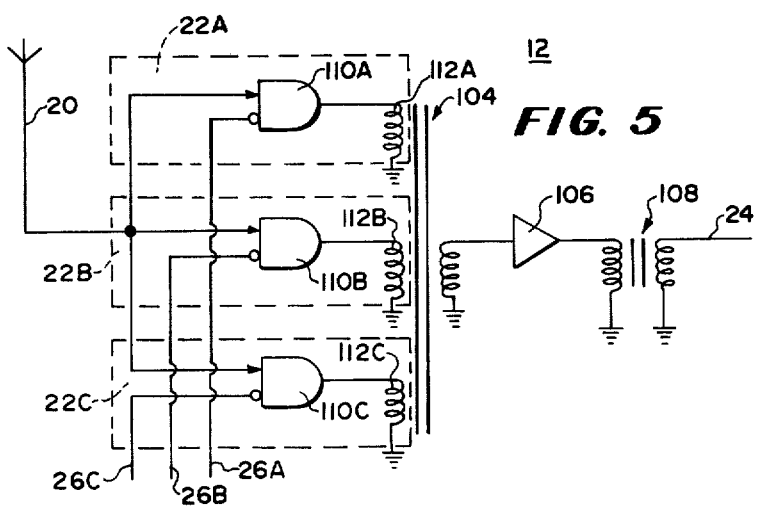
FIG. 5 is a third embodiment of RF section which may be used in the embodiment of scanning radio of FIG. 1.

In FIG. 5, there is shown still another embodiment of radio frequency section 12 having the three amplifying circuits 22A, 22B and 22C, a first broad band toroidal transformer 104, an RF amplifier 106, and a second broad band toroidal transformer 104, an RF amplifier 106, and a second broad band toroidal tansformer 108.

Each of the RF amplifying circuits 22 includes a corresponding one of the gates 110A–110C and a corresponding one of the three primary windings 112A–112C, with one input to each of the gates 110 being connected to the antenna 20 and the other input to the gates being connected to a corresponding one of the conductors 26A–26C, the output from the gates 110 being connected to corresponding ones of the primary windings 112 of the transformer 104. The gates 110 are opened by a ground level pulse to pass RF energy.

The secondary winding of the broad band toroidal transformer 104 is connected to the input of the RF amplifier 106, the output of which is connected to the primary winding of the second toroidal broad band transformer 108. The secondary winding of the transformer 108 is connected to the conductor 24.

In operation, the ground level signal on one of the conductors 26A–26C opens a corresponding one of the gates 110A–110C to pass the carier from the antenna 20 to the corresponding one of the primary windings 112A–112C. The signal applied to the transformer 104 is applied to the input of the broad band RF amplifier 106, which amplifies it and applies it to the primary winding of the transformer 108, the secondary winding of which applies the amplified signal to the adaptive first mixer 14 through the conductor 24.

As can be understood from the above description, the scanning radio of this invention has the advantages of being able to receive channels in different bands without requiring a plurality of first mixers. This enables the receiver to be inexpensive and simple in construction.

Although a preferred embodiment of the invention has been described with some particularity, many modifications and variations in the preferred embodiment may be made without deviating from the invention. Accordingly, it is to be understood, that within the scope of the appended claims, the invention may be practiced other than as specifically described.

What is claimed is:

1. Radio apparatus comprising:
    radio frequency means for receiving radio frequency energy through any of a plurality of different radio frequency paths;
    mixer means for converting said radio frequency energy to intermediate frequency energy;
    processing means for converting said intermediate frequency energy to audio sound vibrations;
    control means for selecting the frequency of radio frequency energy that is to be converted to intermediate frequency energy;
    said control means including local oscillator means for generating a plurality of different frequency local oscillations for application to said mixer means and control signals indicating the one of said different frequency local oscillations to be transmitted to said mixer means;
    said mixer means including means for selecting one of said radio frequency paths in said radio frequency means in response to said control signals from said local oscillator means;
    said mixer means including mixer input conductor means for carrying local oscillations to said mixer and a plurality of different possible conductive paths from said local oscillator means to said mixer input conductor means for said local oscillations;
    some of said conductive paths having a different impedance than other of said conductive paths; and
    means for selecting the path said local oscillations take to said mixer input conductor means in response to said signals.

2. Radio apparatus according to claim 1 further including a different diode in circuit with each of said conductors, said diode having an anode and a cathode, one of the anode and cathode of said diode being electrically connected to said mixer means.

3. Radio apparatus according to claim 2 in which said control means includes:
    a counter; and
    a plurality of selection conductors;
    each of said selection conductors being connected to a different terminal of said counter.

4. Radio apparatus according to claim 3 further including a different diode in circuit with each of said conductors, said diode having an anode and a cathode, one of the the anode and cathode of said diode being electrically connected to said mixer means.

5. Radio apparatus according to claim 4 in which said radio frequency means includes a plurality of different radio frequency amplifiers and an antenna, each of said radio frequency amplifiers having a different input and a different output, each of said inputs being electrically connected to said antenna and each of said outputs being electrically connected to said mixer means.

6. Radio apparatus according to claim 5 in which said mixer means includes a plurality of switching circuits, and said radio amplifiers include a plurality of switches, said switching circuits each including a different means for opening a different switch of said radio frequency amplifiers.

7. Radio apparatus according to claim 5 in which:
    said radio frequency means includes a toroidal transformer;
    said toroidal transformer having a plurality of primary windings and a secondary winding;
    each of said primary windings being connected to a different one of said radio frequency amplifiers;
    said mixer means includes a plurality of switch control means for selectively energizing one of said radio frequency amplifiers;
    said secondary being in circuit with said mixer means.

8. Radio apparatus according to claim 4 in which:
    said radio frequency means includes a toroidal transformer having a plurality of primary windings and a secondary winding, an antenna, radio frequency amplifier, and a plurality of switches;
    each of said primary windings being in circuit with said antenna and a different one of said switches;
    said secondary winding being in circuit with said radio frequency amplifier;
    said mixer means including means for selectively controlling said plurality of switches.

9. Radio apparatus according to claim 2 in which said control means includes:
    a counter; and
    a plurality of selection conductors;
    each of said selection conductors being connected to a different terminal of said counter.

* * * * *